United States Patent
Arifuku et al.

(10) Patent No.: US 6,818,086 B2
(45) Date of Patent: Nov. 16, 2004

(54) METHOD FOR REPAIRING CIRCUIT CONNECTION PART, AND STRUCTURE AND METHOD FOR CONNECTING CIRCUIT TERMINAL OF CIRCUIT REPAIRED BY THE METHOD

(75) Inventors: Motohiro Arifuku, Shimodate (JP); Hiroshi Yasuda, Shimodate (JP); Itsuo Watanabe, Shimodate (JP); Kouji Kobayashi, Shimodate (JP); Isao Tsukagoshi, Tokyo (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 17 days.

(21) Appl. No.: 10/276,179
(22) PCT Filed: May 17, 2001
(86) PCT No.: PCT/JP01/04108
§ 371 (c)(1), (2), (4) Date: Nov. 14, 2002
(87) PCT Pub. No.: WO01/89277
PCT Pub. Date: Nov. 22, 2001

(65) Prior Publication Data
US 2003/0101580 A1 Jun. 5, 2003

(30) Foreign Application Priority Data
May 17, 2000 (JP) ........................................ 2000-144268

(51) Int. Cl.[7] .................. B32B 35/00; B32B 31/22; H01L 21/00; H01L 23/52; B23P 17/00
(52) U.S. Cl. .................... 156/98; 156/230; 156/247; 156/281; 438/4; 438/118; 29/402.03; 257/778; 228/119
(58) Field of Search .................... 156/230, 241, 156/249, 281, 344, 98; 458/4, 108, 118, 119; 29/402.01, 402.03, 402.04, 402.06, 402.08; 361/776; 257/700, 701, 723, 778; 228/19, 119

(56) References Cited

U.S. PATENT DOCUMENTS

| 4,732,642 A | * | 3/1988 | Ametani .................... 156/497 |
| 4,746,388 A | * | 5/1988 | Inaba et al. .................. 156/241 |
| 5,154,793 A | * | 10/1992 | Wojnarowski et al. ...... 156/344 |
| 5,384,955 A | * | 1/1995 | Booth et al. .................. 29/830 |
| 5,423,931 A | * | 6/1995 | Inoue et al. .................. 156/94 |
| 5,466,325 A | * | 11/1995 | Mizuno et al. ............. 156/344 |
| 5,753,563 A | * | 5/1998 | Guan et al. ................. 438/476 |
| 6,062,460 A | * | 5/2000 | Sato ........................... 228/119 |
| 6,076,584 A | * | 6/2000 | Yamamoto et al. ......... 156/584 |
| 6,107,109 A | * | 8/2000 | Akram et al. ................ 438/15 |
| 6,274,389 B1 | * | 8/2001 | Iida et al. ...................... 438/4 |

FOREIGN PATENT DOCUMENTS

| JP | 09-161931 | * 6/1997 | .......... H01R/43/00 |
| JP | 11317173 | 11/1999 | |

* cited by examiner

Primary Examiner—J. A. Lorengo
(74) Attorney, Agent, or Firm—Antonelli, Terry, Stout & Kraus, LLP

(57) ABSTRACT

The present invention is to provide a method for removing adhesive in a short time without requiring any solvent, a repair of which has conventionally been required for a long time, and there is provided a method for repairing a circuit connection part where circuit members having a large number of opposed circuits are connected electrically through an adhesive, wherein mutual joints at a circuit connection part requiring repair are separated, a basic material for transfer is bonded through a transfer adhesive for transfer to at least one circuit member where the adhesive remains and then the adhesive remaining on the circuit member and the transfer adhesive are removed from the circuit member along with the basic material for transfer.

13 Claims, No Drawings

METHOD FOR REPAIRING CIRCUIT CONNECTION PART, AND STRUCTURE AND METHOD FOR CONNECTING CIRCUIT TERMINAL OF CIRCUIT REPAIRED BY THE METHOD

FIELD OF THE INVENTION

The present invention relates to a method for repairing a circuit connection part where a large number of opposed circuits are connected electrically through an adhesive.

BACKGROUND ART

Recently, in the field of precision electronic machines, the density of circuits is becoming higher, and therefore a failure of electrical connection due to removal, peeling or displacement of wiring, or a failure of electronic parts or circuits after connection of the circuits, frequency occurs. Thus, for solving such a problem, a method has been employed in which the circuits are separated from one another by, for example, peeling off, and a residue of the adhesive remaining on or between the circuits is removed using a buffing rotor impregnated with an organic solvent (Japanese Provisional Patent Publication No. 223945/1994) or using a composition for removing an adhesive (Japanese Provisional Patent Publications No. 080939/1994 and No. 080940/1994), followed by connection of the circuits (hereinafter referred to as "reconnection") using a new adhesive.

However, the above methods for removing an adhesive require long-time operations, and it is extremely difficult to completely remove the adhesive remaining in fine portions. Further, the circuit members are exposed to the organic solvent used for removing the adhesive for a long period of time, leading to problems that the dimensional precision of the circuit members becomes poor and removal of a circuit terminal occurs. In addition, when the removal of the adhesive is insufficient or the solvent used causes the electronic parts or the substrate material for the circuit to be repaired to suffer corrosion, problems of a connection failure after reconnection and a lowering of the reliability of connection arise.

The present invention provides a method for removing an adhesive, repair of which has previously required a long period of time, within a short period of time and without damaging the circuit members.

DISCLOSURE OF THE INVENTION

There is provided a method for repairing a circuit connection part where circuit members having a large number of opposed circuits are connected electrically through an adhesive, wherein mutual joints at a circuit connection part requiring repair are separated, a basic material for transfer is bonded through a transfer adhesive for transfer to at least one circuit member where the adhesive remains, and then the adhesive remaining on the circuit member and the transfer adhesive are removed from the circuit member along with the basic material for transfer.

A place where remaining adhesive is removed or peeled off is an interface between the circuit member, and the transfer adhesive and the remaining adhesive.

The present invention is a method for repairing a circuit connection part, in which the adhesive can be removed, within a short period of time and without using any solvent, from the circuit member that has conventionally been repaired using a solvent inevitably, and the present invention can markedly improve the reliability of reconnection.

BEST MODE FOR CARRYING OUT THE INVENTION

With respect to the transfer adhesive used in the present invention, any adhesive described in "Adhesion Handbook" (2nd edition, published by Nikkan Kogyo Shimbun Ltd., edited by The Adhesion Society of Japan), Item II, Column of ADHESIVE, can be preferably used. As the adhesive for bonding together circuit members, an epoxy resin type adhesive is mainly used, and an epoxy resin type transfer adhesive is more preferred because it is expected that the epoxy resin type transfer adhesive strongly adheres to an anisotropic conductive adhesive. Further, when the anisotropic conductive adhesive itself is used as a transfer adhesive, it is especially preferred since it is adhesion of the same kinds of adhesives and the adhesive force therebetween is excellent. The transfer adhesive may be either of a liquid form or of a film form, and the transfer adhesive of a film form is preferred since it has more excellent working properties than those of a liquid form.

With respect to the basic material for transfer used in the present invention, there is no particular limitation as long as the adhesion strength between the basic material for transfer and the transfer adhesive is larger than the adhesion strength between the circuit member to be repaired and the adhesive. For example, there can be preferably used metals and glass each having a surface roughened by an acid or an alkali, metals and glass each having a surface activated by a plasma, ultraviolet, or corona discharge treatment, plastics such as epoxy resins, acrylic resins, polyethersulfone, polyimide and polypropylene, reinforced base materials obtained by impregnating the above plastics into glass woven fabric, and plastics each having a surface activated by a plasma, ultraviolet or corona discharge treatment. The term "metal" used here means any one of elements belonging to Groups 1 and 11 (alkali metals and copper group) exclusive of hydrogen, elements belonging to Groups 2 and 12 (alkaline earth metals and zinc group), elements belonging to Group 3 exclusive of boron, elements belonging to Group 4 exclusive of silicon, and elements belonging to Groups 8 to 10 (iron group and platinum group) and to Groups 5 to 7 (respective sub-a groups of Groups V, VI, and VII) of the Periodic Table, and alloys of at least two elements selected from the above elements, each of which has a higher melting point than the heating temperature for removing the circuit to be repaired from the base material for transfer.

In the present invention, when the circuit to be repaired is removed from the base material for transfer, the circuit connection part can be advantageously repaired by peeling off at the condition of −20° C. to 400° C. The higher the temperature, the lower the adhesion strength, and therefore, it is preferred that the circuit is removed at 100° C. to 400° C. since the damage of the circuit can be suppressed, and it is more preferred that the circuit is removed at 150° C. to 300° C. since not only can the damage of the circuit be suppressed, but also the circuit to be repaired is unlikely to suffer heat deformation.

Further, it is more preferred that heating is conducted from the side of the circuit member to be repaired, because a temperature gradient is caused and the temperature of the interface between the circuit member and the adhesive is higher than the temperature of the interface between the transfer adhesive and the base material for transfer; namely, the degree of lowering of the adhesion strength between the circuit member and the adhesive is larger than the degree of lowering of the adhesion strength between the transfer adhesive and the base material for transfer, thus enabling the adhesive remaining on the circuit member to be easily transferred.

According to the present invention, not only can the circuit member to be repaired be advantageously repaired within a short period of time without using any solvent and without causing the circuit to suffer any damage, but also the circuit member repaired can be remarkably improved in the reliability of the connection after reconnection.

EXAMPLES

Hereinbelow, the present invention will be described in more detail with reference to the following Examples.

Example 1

A flexible printed circuit board (three-layer FPC), which had a three-layer construction comprising polyimide, an adhesive for bonding the polyimide to a copper foil and the copper foil having a thickness of 18 $\mu$m, and which had a line width of 100 $\mu$m and a pitch of 200 $\mu$m, was connected to an ITO substrate (surface resistance <20Ω/□), which was prepared by forming an indium-tin oxide (ITO) film on a glass having a thickness of 1.1 mm by vapor deposition, using an anisotropic conductive film (epoxy type; Anisolm AC-7073; trade name, manufactured by Hitachi Chemical Co., Ltd.) over a width of 2 mm by heating at 180° C. under a pressure of 3 MPa for 10 seconds.

Next, by using a hot plate heated to 250° C., the FPC was peeled off from the ITO substrate while heating the above-prepared connected product from the side of the ITO substrate. When the FPC was removed by this method, a residue of the anisotropic conductive film adhered to the resultant FPC (FPC before being repaired).

The FPC before being repaired was bonded to a surface-roughened copper foil (trade name: GTS-35; manufactured by Furukawa Circuit Foil Co., Ltd.) having a thickness of 35 $\mu$m using the above-mentioned anisotropic conductive film AC-7073 over a width of 2 mm by heating at 180° C. under a pressure of 3 MPa for 10 seconds.

Then, by using a hot plate heated to 250° C., the surface-roughened copper foil was peeled off from the FPC while heating the thus bonded product from the side of the FPC before being repaired. In this step, the residue of the anisotropic conductive film adhering to the FPC before being repaired was transferred to the copper foil, so that the entire electrodes on the FPC were exposed.

Example 2

The FPC before being repaired, prepared in the same manner as in Example 1, was bonded to a surface-roughened copper foil (GTS-35; trade name, manufactured by Furukawa Circuit Foil Co., Ltd.) having a thickness of 35 $\mu$m using a cyanoacrylate type adhesive (Aron Alpha; trade name, manufactured by Toagosei Co., Ltd.) as a transfer adhesive over a width of 2 mm at room temperature.

Then, by using a hot plate heated to 50° C., the surface-roughened copper foil was peeled off from the FPC while heating the thus bonded product from the side of the FPC before being repaired.

Example 3

In a toluene/ethyl acetate mixed solvent having a weight ratio of toluene:ethyl acetate of 50:50 was dissolved 50 g of a phenoxy resin (PKHC; trade name, manufactured by Union Carbide Corporation; average molecular weight: 45,000), to prepare a solution having a solid content of 40% by weight.

Preparation of Transfer Adhesive 1

50 Parts by weight of the above-mentioned phenoxy resin as a film-forming material, 49 parts by weight of trihydroxy-ethyl glycol dimethacrylate (80MFA; trade name, manufactured by KYOEISHA CHEMICAL Co., LTD.), 1 part by weight of a phosphate-type acrylate (P-2M; trade name, manufactured by KYOEISHA CHEMICAL Co., LTD.) as radical polymerization substance, and 5 parts by weight of a 50% by weight DOP solution of t-hexyl peroxy-2-ethylhexanonate (Percure HO; trade name, manufactured by NOF Corporation) as a free radical generating agent, were mixed together; and, using a coating machine, the resultant mixture was applied onto a PET film having a thickness of 80 $\mu$m and one surface of which had been subjected to surface treatment, and dried by hot air at 70° C. for 10 minutes to obtain Transfer adhesive 1 having an adhesive layer thickness of 35 $\mu$m.

By using Transfer adhesive 1 as a transfer adhesive, a repair on an FPC was conducted in substantially the same manner as in Example 1 except that the FPC before being repaired, prepared in the same manner as in Example 1, was bonded to a surface-roughened copper foil (GTS-35; trade name, manufactured by Furukawa Circuit Foil Co., Ltd.) having a thickness of 35 $\mu$m over a width of 2 mm by heating at 150° C. under a pressure of 3 MPa for 10 seconds.

Example 4

A repair on an FPC was conducted in substantially the same manner as in Example 1 except that the three-layer FPC was changed to a flexible printed circuit board (two-layer FPC) comprised of a 12 $\mu$m thick copper foil directly on polyimide and having a circuit comprising a line width of 50 $\mu$m and a pitch of 100 $\mu$m.

Example 5

An adhesive film (HITALEX L-3360; trade name, manufactured by Hitachi Chemical Co., Ltd.) having an adhesive layer formed on a polypropylene base material was bonded to the FPC before being repaired, and then the adhesive film was peeled off from the FPC at room temperature. According to this step, the anisotropic conductive film residue adhering to the FPC before being repaired was transferred to the adhesive film, so that the electrodes on the FPC were completely exposed.

Example 6

A repair on an FPC was conducted in substantially the same manner as in Example 3 except that the surface-roughened copper foil was changed to an epoxy plate having a thickness of 0.8 mm and containing therein glass fiber.

Example 7

A repair on an FPC was conducted in substantially the same manner as in Example 3 except that the surface-roughened copper foil was changed to a stainless steel plate, a surface of which has been subjected to plasma treatment and having a thickness of 1 mm.

Example 8

A repair on an FPC was conducted in substantially the same manner as in Example 3 except that the surface-roughened copper foil was changed to a copper plate, a surface of which had been subjected to plasma treatment and having a thickness of 1 mm.

Example 9

A repair on an FPC was conducted in substantially the same manner as in Example 3 except that the surface-roughened copper foil was changed to a soda glass, a surface of which had been subjected to plasma treatment and having a thickness of 1 mm.

Example 10
Preparation of Transfer Adhesive 2

50 Parts by weight of the above-mentioned phenoxy resin as a film-forming material, 40 parts by weight of an epoxy acrylate oligomer (NK Oligo EA-1020; trade name, manufactured by Shin-Nakamura Chemical Co., Ltd.), 10 parts by weight of an acrylate monomer (NK Ester A-TMM-3L; trade name, manufactured by Shin-Nakamura Chemical Co., Ltd.) as radical polymerization substance, 5 parts by weight of benzophenone as a free radical generating agent, and 1 part by weight of 4,4'-bisdiethylaminobenzophenone (EAB; trade name, manufactured by Hodogaya Chemical Co., Ltd.) as a sensitizer were mixed together; and, using a coating machine, the resultant mixture was applied onto a PET film having a thickness of 80 $\mu$m and one surface of which had been subjected to surface treatment, and dried by hot air at 70° C. for 10 minutes to obtain Transfer adhesive 2 having an adhesive layer thickness of 35 $\mu$m.

The FPC before being repaired, prepared in the same manner as in Example 1, was connected to a soda glass having a surface treated by plasma and having a thickness of 1 mm using the above-obtained Transfer adhesive 2 over a width of 2 mm by heating at 130° C. under a pressure of 2 MPa for 20 seconds simultaneously with irradiation with ultraviolet rays from the side of the soda glass by means of an ultraviolet radiation heat pressing machine (heating mode: constantly heating; manufactured by Toray Engineering Co., Ltd.). The dose of ultraviolet rays for the adhesive was made 2.0 J/cm$^2$.

Then, the FPC was peeled off from the soda glass while heating the thus connected product from the side of the soda glass using a hot plate heated to 250° C. In this step, the anisotropic conductive film residue adhering to the FPC before being repaired was transferred to the soda glass, so that the electrodes on the FPC were completely exposed.

Example 11

A repair on an FPC was conducted in substantially the same manner as in Example 3 except that the bonded product was heated from the side of the surface-roughened copper foil.

Example 12

A repair on an FPC was conducted in substantially the same manner as in Example 3 except that the bonded product was heated from the side of the three-layer FPC using a spot heater (manufactured by Hakko Corporation) instead of the hot plate.

Example 13

The adhesive remaining in a slight amount on the three-layer FPC repaired in Example 3 was removed for 1 minute using a swab impregnated with acetone.

Comparative Example 1

No repair on the FPC was conducted in Comparative Example 1.

Comparative Example 2

The residue remaining on the electrode portion of the FPC before being repaired was removed using a swab impregnated with acetone so that the electrodes on the FPC were exposed.
(Connection of Circuits)

The FPCs prepared in Examples 1 to 13 and Comparative Examples 1 and 2 were individually connected to an ITO substrate (surface resistance <20 $\Omega/\square$), which was prepared by forming an indium-tin oxide (ITO) film on a glass having a thickness of 1.1 mm by vapor deposition, using an anisotropic conductive film over a width of 2 mm by heating at 180° C. under a pressure of 3 MPa for 10 seconds.
(Measurement of Connection Resistance)

After reconnection of the circuits, with respect to the resistance between the adjacent circuits of the FPC containing the above connection part, an initial value and a value after keeping the FPC in a high temperature and high humidity controlled bath at 85° C. and 85% RH (relative humidity) for 500 hours were measured by means of a multi-meter. Each resistance value was indicated by an average of 150 resistance values measured between the adjacent circuits.
(Measurement of Adhesion Strength)

After connection of the circuits, an adhesion strength was measured by performing a 90° peel test at a peel rate of 50 mm/min.
(Evaluation of Insulation Properties)

The repaired circuit was connected to a printed board, which had a comb-form circuit formed by alternately disposing 250 copper circuits each having a line width of 100 $\mu$m, a pitch of 200 $\mu$m, and a thickness of 18 $\mu$m, over a width of 2 mm by heating at 160° C. under a pressure of 3 MPa for 10 seconds. A voltage at 100 V was applied to the comb-form circuit in the thus connected product, and the product was subjected to a high temperature and high humidity test at 85° C. and 85% RH for 500 hours, and then an insulation resistance value was measured.

The results of the measurements are shown in Table 1.

TABLE 1

| Repairing method | Initial Connection Resistance ($\Omega$) | Connection resistance after high temperature and high humidity test ($\Omega$) | Initial Adhesion strength (N/m) | Adhesion strength after high temperature and high humidity test (N/m) | Insulation resistance after high temperature and high humidity test ($\Omega$) | Time required for repair (min) |
|---|---|---|---|---|---|---|
| Example 1 | 1.4 | 1.6 | 1200 | 1000 | $4 \times 10^{10}$ | 5 |
| Example 2 | 1.7 | 2.1 | 1100 | 900 | $1 \times 10^{9}$ | 4 |
| Example 3 | 0.9 | 1.1 | 1200 | 1000 | $1 \times 10^{11}$ | 5 |

TABLE 1-continued

| Repairing method | Initial Connection Resistance (Ω) | Connection resistance after high temperature and high humidity test (Ω) | Initial Adhesion strength (N/m) | Adhesion strength after high temperature and high humidity test (N/m) | Insulation resistance after high temperature and high humidity test (Ω) | Time required for repair (min) |
|---|---|---|---|---|---|---|
| Example 4 | 0.9 | 1.2 | 820 | 510 | $3 \times 10^9$ | 5 |
| Example 5 | 1.8 | 2.0 | 1100 | 800 | $2 \times 10^9$ | 2 |
| Example 6 | 1.3 | 1.4 | 1500 | 1300 | $5 \times 10^{10}$ | 5 |
| Example 7 | 1.4 | 1.6 | 1100 | 1000 | $5 \times 10^{10}$ | 5 |
| Example 8 | 1.4 | 1.5 | 1000 | 900 | $7 \times 10^{10}$ | 5 |
| Example 9 | 1.4 | 1.5 | 1300 | 1000 | $6 \times 10^9$ | 5 |
| Example 10 | 1.2 | 1.4 | 1400 | 1100 | $6 \times 10^9$ | 5 |
| Example 11 | 1.8 | 2.2 | 1300 | 1000 | $4 \times 10^9$ | 5 |
| Example 12 | 1.1 | 1.2 | 1200 | 1100 | $1 \times 10^{10}$ | 3 |
| Example 13 | 0.9 | 10 | 1600 | 1400 | $7 \times 10^{10}$ | 6 |
| Comparative example 1 | >100 | >100 | 600 | 300 | $3 \times 10^9$ | — |
| Comparative example 2 | 3.2 | 10.9 | 700 | 300 | $3 \times 10^9$ | 20 |

In Example 1, with respect to the initial connection resistance, the connection resistance and the adhesion strength after the high temperature and high humidity test, and the insulation resistance after the high temperature and high humidity treatment, were excellent. In addition, the time required for repairing the FPC in Example 1 was as short as ¼ the time required in Comparative Example 1.

Also in Example 2, excellent connection was achieved, and the transfer adhesive could be used at room temperature, and hence a repair on the FPC could be done in a short time in Example 2, as compared with that in Example 1.

In Example 3, the transfer adhesive could be used at a lower temperature than that in Example 1 and a damage of the circuit in the FPC was suppressed, and hence an excellent connection resistance value was obtained in Example 3, as compared with that in Example 1.

In Example 4, it has been confirmed that excellent connection can be achieved in the repair on a two-layer FPC.

In Example 5, the adhesive layer as a transfer adhesive was preliminarily formed on polypropylene as a base material for transfer and the transfer adhesive could be used at room temperature, and therefore a repair on the FPC could be done in a short period of time.

In each of Examples 6 to 9, it has been confirmed that a repair on the FPC can be advantageously achieved even when the type of the base material for transfer is changed.

In Example 10, the transfer adhesive could be used at a lower temperature than that in Example 1 and a damage of the circuit in the FPC was suppressed, and hence an excellent connection resistance value was obtained in Example 10, as compared with that in Example 1.

In Example 11, it has been confirmed that a repair on the FPC can be achieved when heating from the side of the base material for transfer.

In Example 12, the spot heater can heat the FPC efficiently, as compared with the hot plate, and therefore the time required for the repair could be further shortened.

In Example 13, the residue of the anisotropic conductive adhesive remaining in a slight amount on the FPC repaired in Example 3 could be removed by washing the FPC with a solvent, and hence, an excellent connection resistance value was obtained in Example 13, as compared with that in Example 1.

In Comparative Example 1, a large amount of the anisotropic conductive adhesive remained on the FPC, and therefore no electrical connection could be achieved after reconnection due to the remaining anisotropic conductive adhesive.

In Comparative Example 2, a repair on the FPC was conducted using a solvent and thus the FPC was attacked by the solvent, so that removal of an electrode from the FPC occurred, increasing the connection resistance.

INDUSTRIAL APPLICABILITY

The present invention is a method for removing an adhesive in a short period of time, without using any solvent and without causing the circuit member to suffer any damage from the circuit member that has conventionally been repaired using a solvent inevitably, and the method is advantageous in that the reliability after reconnection can be remarkably improved.

What is claimed is:

1. A method for repairing a circuit connection part where circuit members having a large number of opposed circuits are connected electrically through an adhesive, comprising:
    separating mutual joints at a circuit connection part requiring repair;
    bonding a basic material for transfer, through a transfer adhesive for transfer, to at least one circuit member where the adhesive remains; and
    then removing the adhesive remaining on the circuit member and the transfer adhesive from the circuit member along with the basic material for transfer.

2. The method for repairing a circuit connection part according to claim 1, further comprising carrying out heating from the side of the circuit member, at the time of removing the adhesive remaining on the circuit member, to cause a temperature gradient from the circuit member to the basic material for transfer the temperature being higher at the circuit member.

3. The method for repairing a circuit connection part according to claim 1, wherein the base material for transfer Is a metal surface of which is roughened, or a metal or plastic a surface of which is activated.

4. The method for repairing a circuit connection part according to claim 1, further comprising, after the removing the adhesive remaining on the circuit member, washing the circuit member to be repaired with an organic solvent.

5. The method for repairing a circuit connection part according to claim 1, wherein the transfer adhesive is the same adhesive to be used for connecting the circuit connection part requiring repair.

6. The method for repairing a circuit connection part according to claim 2, wherein the base material for transfer is a metal surface of which is roughened, or a metal or plastic a surface of which is activated.

7. The method for repairing a circuit connection part according to claim 6, further comprising, after the removing the adhesive remaining on the circuit member, washing the circuit member to be repaired with an organic solvent.

8. The method for repairing a circuit connection part according to claim 7, wherein the transfer adhesive is the same adhesive to be used for connecting the circuit connection part requiring.

9. The method for repairing a connection part according to claim 1, wherein the transfer adhesive is an epoxy resin adhesive.

10. The method for repairing a connection part according to claim 2, wherein said carrying out heating is performed using a heater at a temperature in the range of 100° C. to 400° C.

11. The method for repairing a connection part according to claim 10, wherein said heater is at a temperature of 150° C. to 300° C.

12. A method for connecting circuit terminals, comprising:
positioning a first circuit member having a first connecting terminal and a second circuit member having a second connecting terminal such that the first connecting terminal and the second connecting terminal are opposed to each other;
interposing an anisotropic conductive adhesive composition between the first connecting terminal and the second connecting terminal which are opposed to each other; and
electrically connecting the first connecting terminal and the second connecting terminal which are opposed to each other
wherein at least one of the first circuit member and the second circuit member is a circuit member in which the circuit has been repaired by the method for repairing a circuit connection part according to claim 1.

13. A method for connecting circuit terminals, comprising:
positioning a first circuit member having a first connecting terminal and a second circuit member having a second connecting terminal such that the first connecting terminal and the second connecting terminal are opposed to each other;
interposing an anisotropic conductive adhesive composition between the first connecting terminal and the second connecting terminal which are opposed to each other; and
electrically connecting the first connecting terminal and the second connecting terminal which are opposed to each other,
wherein at least one of the first circuit member and the second circuit member is a circuit member in which the circuit has been repaired by the method for repairing a circuit connection part according to claim 8.

* * * * *